United States Patent [19]
Yamada et al.

[11] Patent Number: 5,461,256
[45] Date of Patent: Oct. 24, 1995

[54] PORTABLE SEMICONDUCTOR DEVICE WITH RESIN

[75] Inventors: Akira Yamada; Fumiaki Baba, both of Amagasaki; Syojiro Kodai, Sanda; Tsuguo Kurisu, Sanda; Makoto Kobayashi, Sanda, all of Japan

[73] Assignee: Mitsubishi Denki Kabushiki Kaisha, Tokyo, Japan

[21] Appl. No.: 145,224

[22] Filed: Nov. 3, 1993

[30] Foreign Application Priority Data

Nov. 6, 1992 [JP] Japan ................................ 4-297360

[51] Int. Cl.$^6$ ................................... G06K 19/00
[52] U.S. Cl. ...................... 257/679; 257/723; 257/687; 361/737
[58] Field of Search ................... 257/679, 687, 257/723; 156/244.12; 361/737, 728

[56] References Cited

U.S. PATENT DOCUMENTS

| | | | |
|---|---|---|---|
| 4,322,001 | 3/1982 | Hurley | 206/449 |
| 4,330,350 | 5/1982 | Andrews | 156/152 |
| 4,617,216 | 10/1986 | Haghiri-Tehrani et al. | 428/67 |
| 4,746,392 | 5/1988 | Hoppe | 156/244.12 |
| 5,013,900 | 5/1991 | Hoppe | 257/679 |
| 5,067,008 | 11/1991 | Yanaka et al. | 257/679 |
| 5,192,682 | 3/1993 | Kodai et al. | 437/219 |

*Primary Examiner*—William Mintel
*Assistant Examiner*—Roy Potter
*Attorney, Agent, or Firm*—Burns, Doane, Swecker & Mathis

[57] ABSTRACT

At least one part of a two-part container of a portable semiconductor device has an electronic part accommodating portion, a foamed resin accommodating portion provided at a peripheral edge portion of the container for accommodating an excess of foamed resin, and a coupling groove for coupling the electronic part accommodating portion to the foamed resin accommodating portion. Since the electronic parts and a circuit board are completely embedded in the device, a semiconductor device exhibiting excellent resistance to environment can be manufactured by a simple process.

27 Claims, 9 Drawing Sheets

PORTABLE SEMICONDUCTOR DEVICE WITH RESIN

BACKGROUND OF THE INVENTION

1. Field of the Invention

The present invention relates to a portable semiconductor device and a method of manufacturing the same. More particularly, the present invention relates to a portable semiconductor device in which functional parts of the thin semiconductor device, such as an IC card or a non-contact IC card, are embedded in a foamed resin and protected by a resin or the like, and a method of manufacturing such a portable semiconductor device.

2. Description of the Related Art

Figure 20:
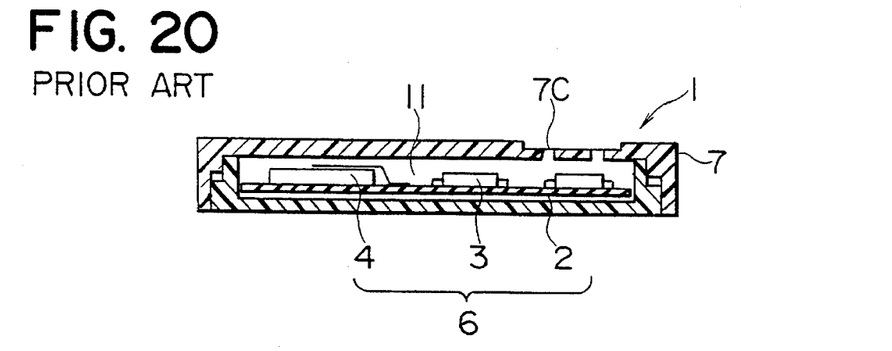
FIG. 20 is a cross-sectional view of an example of a conventional portable semiconductor device.

Portable semiconductor devices (hereinafter referred to as IC cards) in which electronic parts thereof are embedded in a card body in order to eliminate space in the body are known. FIG. 20 illustrates the manufacturing method of a non-contact IC card having the above-described configuration, disclosed in Japanese Patent Laid-Open No. 1-241496. To manufacture an IC card 1 shown in FIG. 20, first a module 6, in which an IC 3 and an electric cell 4 are mounted on a circuit board 2, is accommodated in a casing 7. Next, a thermosetting resin 11 is injected into the casing 7 from a hole 7C formed in an upper casing portion and then set by heating the resin in such a manner that there is no space left in the casing 7 so as to fix the casing 7 and the module 6 as one unit.

Figure 21:
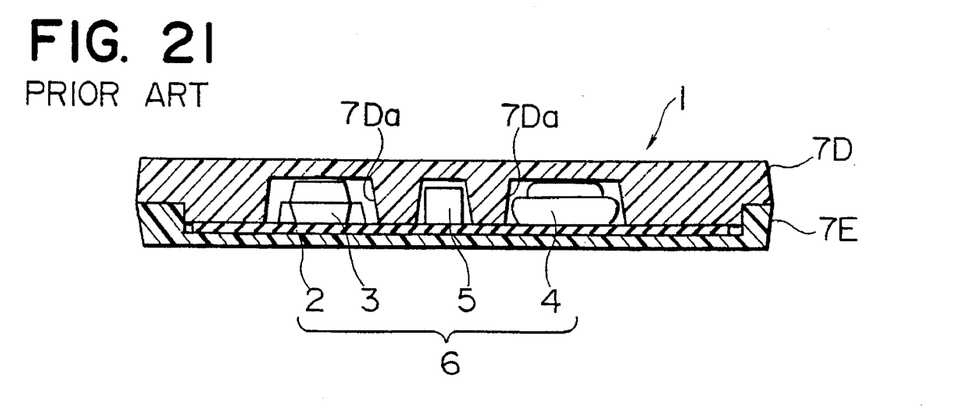
FIG. 21 is a cross-sectional view of another example of the conventional portable semiconductor device.

In another conventional manufacturing method shown in FIG. 21, the module 6 is sandwiched by casing portions 7D and 7E, and then the two casing portions 7D and 7E are adhered to each other to form the IC card 1. The casing is made up of the upper and lower casing portions 7D and 7E. The inner surface of the upper casing portion 7D has recessed portions 7Da corresponding to the irregularities of the parts mounted in the module 6. To complete the IC card 1, the module 6 is fitted into the upper casing portion 7D, and then the lower casing portion 7E is adhered to the upper casing portion 7D to cover the module 6.

Since the IC cards 1 shown are of the portable type, if there is a space within the IC card 1, the IC card 1 may readily break. This drawback may be eliminated by increasing the thickness of the casing 7. However, this makes it inconvenient for the card to be carried from one place to another. Further, if there is a space in the IC card 1, the surface of the IC card 1 may partially recede inwardly when the design is printed on the surface of the IC card 1. The configuration of the IC cards 1 shown in FIGS. 20 and 21 ensures an increases in the strength of the IC card 1, and eliminates the drawbacks generated during printing.

However, in the method in which the resin is injected into the casing from part thereof to fill in the space in the casing after the module is accommodated in the casing, the resin is injected into the casing under a vacuum so that the casing can be completely filled with the resin. However, the degree to which the injected resin is excessive or short or the degree to which the injected resin shrinks due to setting, partially differs depending on the presence or absence of the built-in parts, resulting in undulation of the surface of the IC card and making the provision of a flat and uniform surface difficult. In addition, the injected resin may soil the outer surface of the IC card.

Where the module is accommodated in the casing having irregularities corresponding to the module, the casing which can engage with the built-in module is required. This in turn requires the same number of molds as that of card types. In this case, partial alteration in the parts mounted on the circuit board requires alteration of the mold.

SUMMARY OF THE INVENTION

Accordingly, an object of the present invention is to provide a portable semiconductor device in which functional parts of the IC card are completely embedded in a card substrate and which is small and thin and exhibits excellent resistance to environment, and a method of manufacturing such a portable semiconductor device which enables the highly reliable devices to be efficiently manufactured.

In order to achieve the above object, according to one aspect of the present invention, there is provided a portable semiconductor device which comprises a two-part container serving as an outer skin, a circuit board on which electronic parts are mounted, the circuit board being accommodated in the container, and a foamed resin filled in a gap between the container and the circuit board. At least one part of the two-part container has a recessed electronic part accommodating portion in which the electronic parts mounted on the circuit board are accommodated and in which the foamed resin is charged, and a foamed resin accommodating portion provided at a peripheral edge portion of the container to accommodate an excess of foamed resin, and a coupling groove for coupling the electronic part accommodating portion to the foamed resin accommodating portion.

According to another aspect of the present invention, there is provided a portable semiconductor device which comprises a container serving as an outer skin, the container including a frame serving as an outer edge portion, and a surface sheet material adhered to each of two surfaces of the frame, a circuit board on which electronic parts are mounted, the circuit board being accommodated in the container, and a foamed resin filling a gap between the container and the circuit board. A rib is formed integrally with the frame on an inner side of the frame, whereby an electronic part accommodating portion in which the electronic parts on the circuit board are mounted and in which the foamed resin is charged is formed on an inner side of the rib and whereby a foamed resin accommodating portion for accommodating an excess of the foamed resin in the electronic part accommodating portion is formed between the rib and the a peripheral edge portion of the frame. A coupling groove for coupling the electronic part accommodating portion to the foamed resin accommodating portion is provided.

According to another aspect of the present invention, there is provided a method of manufacturing a portable semiconductor device, which comprises the steps of accommodating a circuit board on which electronic parts are mounted in an electronic part accommodating portion in a container and filling a solid formable resin in the electronic part accommodating portion, and foaming the solid formable resin and filling the electronic part accommodating portion with the formable resin while discharging an excess of foamable resin from the electronic part accommodating portion into a foamed resin accommodating portion through a coupling groove and setting the foamable resin.

In the present invention, the electronic parts are completely embedded in the foamed resin which fills the electronic part accommodating portion of the container, and an excess of the foamable resin flows through the coupling groove and is absorbed by the foamed resin accommodating portion and thus does not eject to the outer surface of the container.

Further, the solid foamable resin injected into the container expands its volume in the setting reaction and fills in the electronic part accommodating portion. An excess of foamable resin is introduced into the foamed resin accommodating portion through the coupling groove.

DETAILED DESCRIPTION OF THE PREFERRED EMBODIMENTS

First Embodiment

An embodiment of the present invention will be described below with reference to the accompanying drawings. In the drawings, identical reference numerals are used to denote identical or similar elements.

Figure 1:
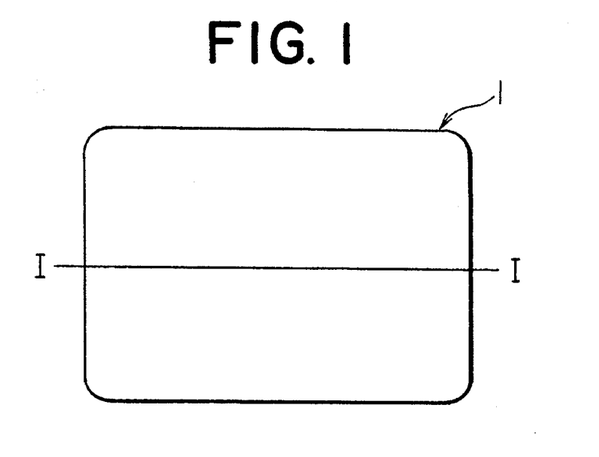
FIG. 1 is a plan view illustrating a first embodiment of a portable semiconductor device according to the present invention.
Figure 2:
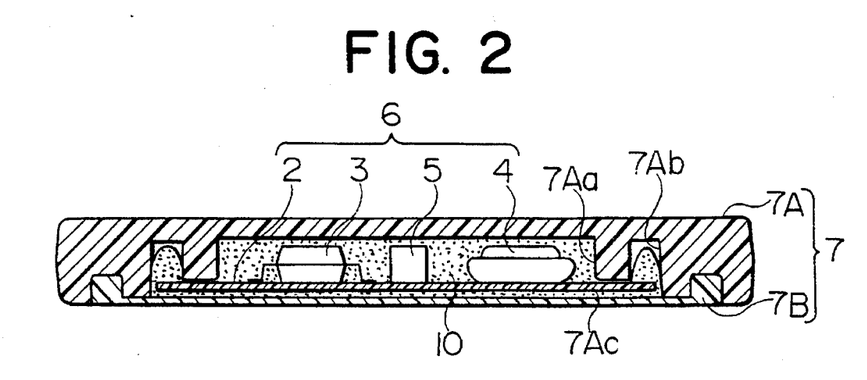
FIG. 2 is an enlarged cross-section taken along the line I—I of FIG. 1.

FIG. 1 is a plan view showing a first embodiment of a portable semiconductor device according to the present invention which may be an IC card. FIG. 2 is an enlarged cross-sectional view taken along the line I—I of an IC card 1 shown in FIG. 1.

In these figures, a module 6, in which electrical parts, such as an IC 3, an electric cell 4 and another part 5 are mounted on a circuit board 2, is accommodated in a casing 7, which serves as an outer skin of the IC card 1. Examples of the electronic parts include functional parts, such as the IC 3, parts, such as a resistor or capacitor, the electric cell 4 serving as a powder source and an interconnection circuit (not shown).

A foamed resin 10 is charged in the casing 7 to fill in the space around the electronic parts in the casing. In this embodiment, a three-part type intermediate temperature setting epoxy resin was used as the foamed resin 10.

Figure 3:
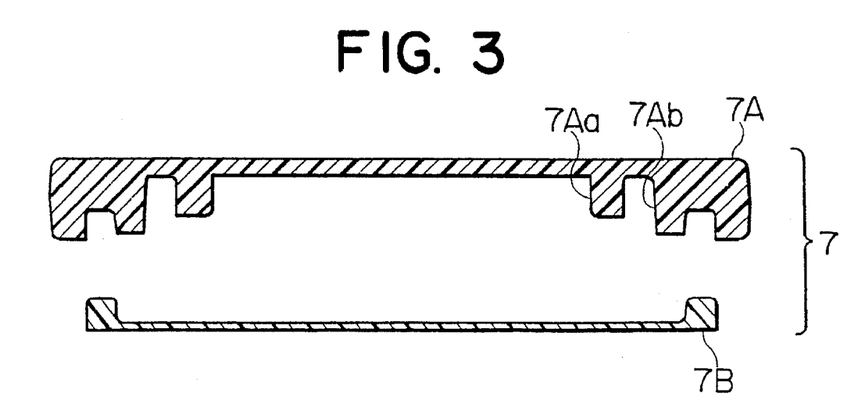
FIG. 3 is a cross-sectional view illustrating a casing serving as an outer container of the portable semiconductor device shown in FIG. 1.

FIG. 3 is a cross-sectional view of the casing 7 serving as the outer skin of the IC card 1. The casing 7 is made up of an upper casing portion 7A and a lower casing portion 7B. The two casing portions are joined to each other by fitting the lower casing portion 7B into an opening of the upper casing portion 7A.

Figure 4:
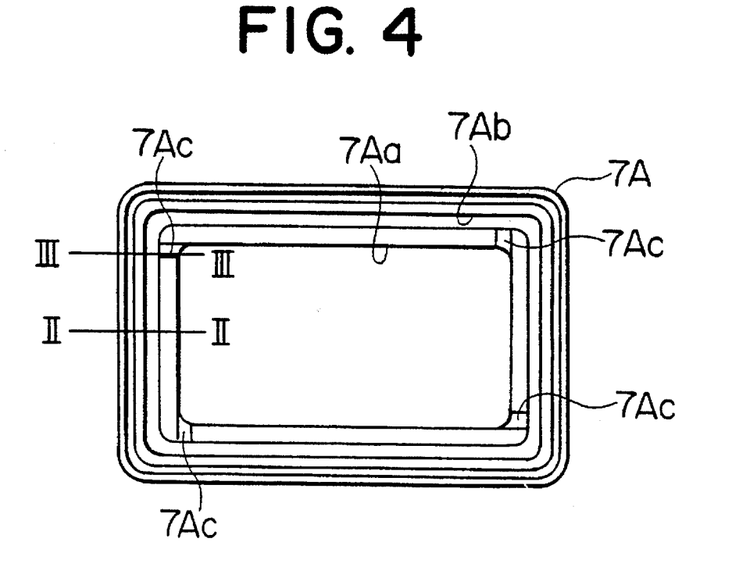
FIG. 4 is a plan view of an upper casing portion shown in FIG. 2 as seen when looking from the inner side thereof.

FIG. 4 is a plan view of the upper casing portion 7A as seen when looking from the inner surface side thereof. The upper casing portion 7A has an electronic part accommodating portion 7Aa in which the electronic parts are accommodated, and a groove-shaped foamed resin accommodating portion 7Ab formed in a peripheral edge portion of the upper casing portion 7A to accommodate an excess of foamed resin. The electronic part accommodating portion 7Aa and the foamed resin accommodating portion 7Ab are joined to each other through coupling grooves 7Ac at positions corresponding to the four corners of the electronic part accommodating portion 7Aa.

Figure 5A:
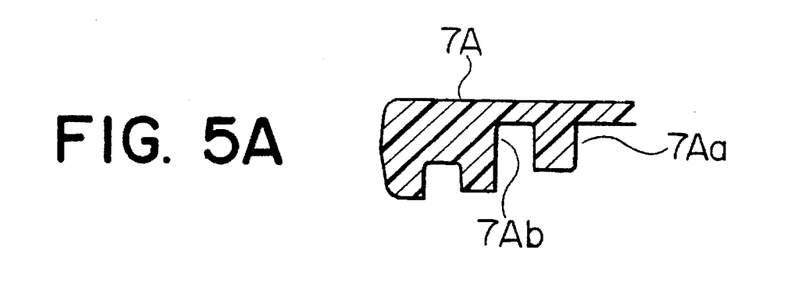
FIG. 5A is a cross-section taken along the line II—II of FIG. 4.
Figure 5B:
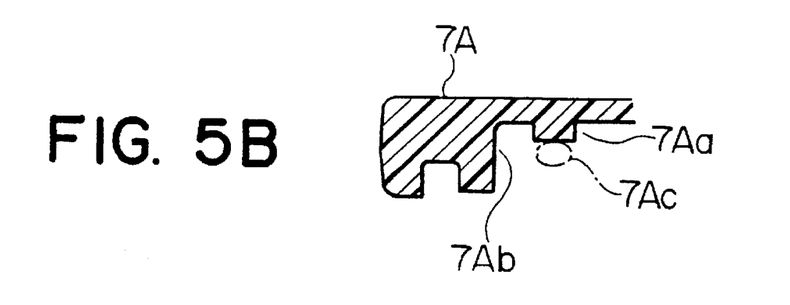
FIG. 5B is a cross-section taken along the line III—III of FIG. 4.

FIG. 5A is a cross-section taken along the line II—II of FIG. 4. FIG. 5B is a section taken along the line III—III of FIG. 4. In these figures, the coupling groove 7Ac has a structure which enables the electronic part accommodating portion 7Aa and the foamed resin accommodating portion 7Ab to join each other.

Figure 6A:
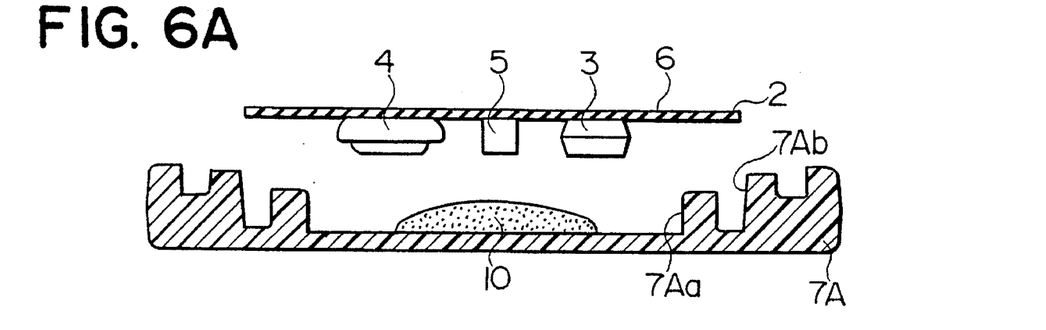
FIG. 6A is a cross-sectional view illustrating a state wherein a formable resin and a module are inserted into the upper casing portion.

The IC card 1 having the aforementioned configuration is manufactured by the procedures shown in FIGS. 6A through 6D. FIGS. 6A through 6D are respectively schematic cross-sectional views of the IC card. First, a predetermined amount of solid foamable resin 10 is injected into the electronic part accommodating portion 7A*a* of the upper casing 7A placed with the opening thereof directed upward, and then the module 6, in which the IC 3, the electric cell 4, the part 5 and so on are mounted on the circuit board 2, is placed on the solid foamable resin 10 with the electronic part mounting surface thereof directed downward, as shown in FIG. 6A.

Figure 6B:
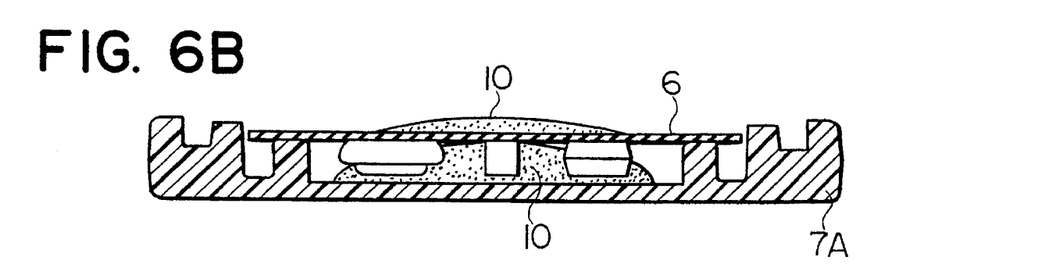
FIG. 6B is a cross-sectional view illustrating a state wherein the foamable resin is further injected.
Figure 6C:
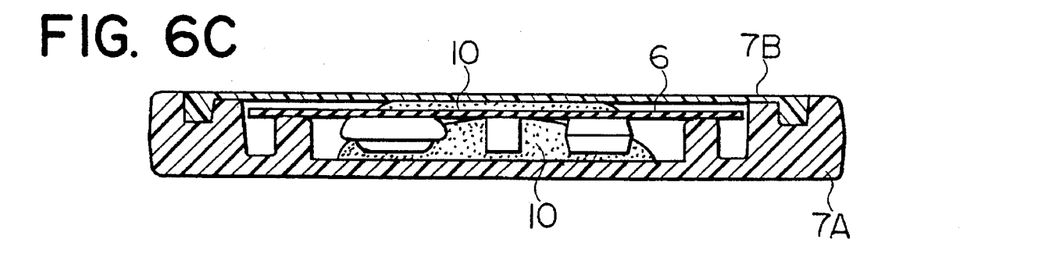
FIG. 6C is a cross-sectional view illustrating a state in which a lower casing portion is fitted into the upper casing portion to obtain a substantially sealed state.

Next, a predetermined amount of solid foamable resin 10 is placed substantially at the central portion of the module 6, as shown in FIG. 6B, and then the lower casing portion 7B is fitted into the opening of the upper casing portion 7A, as shown in FIG. 6C, whereby the fitted portion is made substantially sealed. Accordingly, although a slight amount of air may leak, no resin leaks from the casing.

Figure 6D:
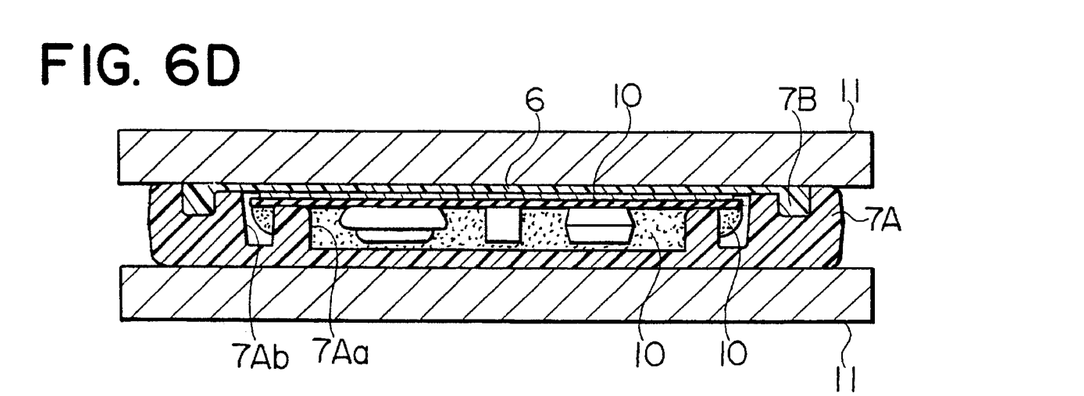
FIG. 6D is a cross-sectional view illustrating a state wherein e portable semiconductor device is sandwiched by a hardening jig and the foamable resin is foamed and set.

In that state, the casing 7 is sandwiched and fixed by a hardening jig 11 having flat surfaces, as shown in FIG. 6D, and then the casing 7 is heated in that fixed state to harden the foam the solid foamable resin 10. FIG. 6D illustrates the state where the foamable resin 10 is foaming and hardening by heating. The foamable resin 10 is expanding by foaming and filling in the electronic part accommodating portion 7A*a* with an excess of resin passing through the coupling grooves 7A*c* and flowing into the foamed resin accommodating portion 7A*b*.

The solid foamable resin 10 is charged in the predetermined amount which allows it to fill in the electronic part accommodating portion 7A*a* and part of the foamed resin accommodating portion 7A*b*. In this way, non-filling of the electronic part accommodating portion 7A*a* is avoided. Further, when the void of the foamed resin 10 is about 10%, the foamed resin 10 fills in the casing 7 with an excess of resin restricted by the hardening jig 11 and slightly increasing the inner pressure of the casing 7, and no resin overflows the casing 7.

In the first embodiment, a formed product of glass filled liquid crystal polymer exhibiting excellent formability is used as the casing 7. A three-part type intermediate temperature setting foamable epoxy resin, composed of a chief material, a foaming agent and a hardener, is used as the foamable resin 10. This foamable epoxy resin starts foaming and setting when the chief material, the foaming agent and the hardener are mixed with each other. The compounded epoxy resin is has a viscosity of 50,000 cp and is slightly thixotropic which indicates that the resin does not readily flow naturally but is easily deformable. Thus, when injected into the casing 7, the foamable epoxy resin expands by foaming and fills in the electronic part accommodating portion 7A*a* with an excess of resin overflowing from the electronic part accommodating portion 7A*a* into the foamed resin accommodating portion 7A*b* through the coupling grooves 7A*c* provided at the four corners of the electronic part accommodating portion 7A*a*. When heated at a rate of 50° C./hour, the foamable epoxy resin becomes a set resin having a void of about 50% in terms of the closed cells. The modulus of elasticity in bending of the set foamed resin is about 60 kg/mm$^2$.

Second Embodiment

Figure 7:
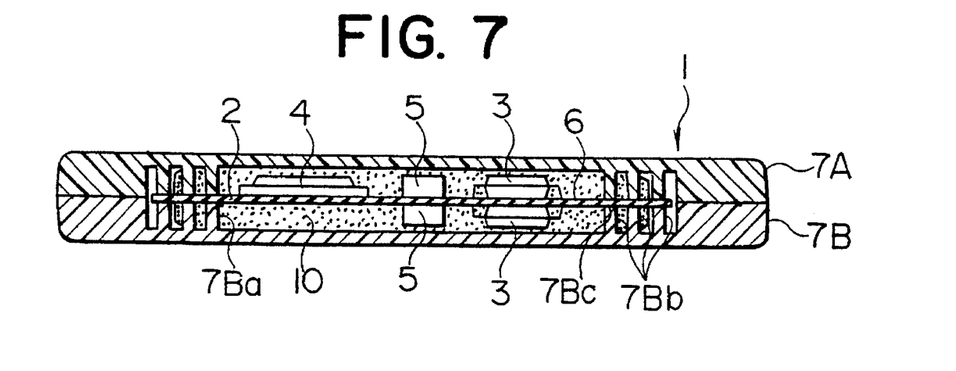
FIG. 7 is a cross-sectional view illustrating a second embodiment of the portable semiconductor device according to the present invention.
Figure 8:
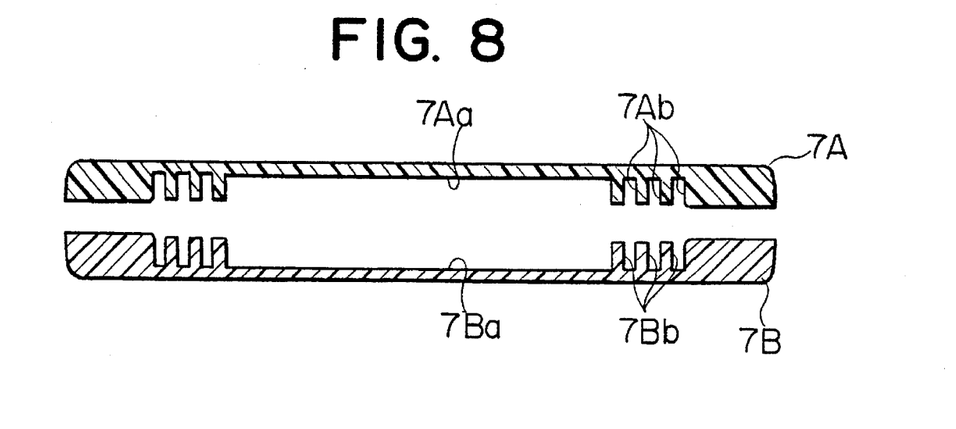
FIG. 8 is a cross-sectional view illustrating a casing used in the portable semiconductor device shown in FIG. 7.

FIG. 7 is a cross-sectional view of a second embodiment of the IC card 1 according to the present invention. FIG. 8 is a cross-sectional view of the casing 7 which serves as the outer skin of the IC card 1 shown in FIG. 7. The casing 7 is made up of the upper casing portion 7A and the lower casing portion 7B which respectively have electronic part accommodating portions 7A*a* and 7B*a* and foamed resin accommodating portions 7A*b* and 7B*b* for accommodating an excess of foamed resin 10. The material of and the manufacturing method of the IC card 1 are the same as those of the first embodiment.

Among the electronic part accommodating portions 7A*a* and 7B*a* and the foamed resin accommodating portions 7A*b* and 7B*b* provided in the casing 7, each of the foamed resin accommodating portions 7A*b* and 7B*b* is made up of three ring-shaped grooves. Although not shown, coupling grooves 7A*c* and 7B*c* are respectively formed at the four corners of the electronic part accommodating portions 7A*a* and 7B*a* to join the electronic part accommodating portions 7A*a* and 7B*a* to the foamed resin accommodating portions 7A*b* and 7B*b*, respectively. After the foamable resin 10 foams and fills in the electronic part accommodating portions 7A*a* and 7B*a*, it passes through the coupling grooves 7A*c* and 7B*c* and flows into the foamed resin accommodating portions 7A*b* and 7B*b*.

In the second embodiment, the IC 3, the electronic cell 4 and another part 5 are mounted on each of the two surfaces of the circuit board 2. Thus, the IC card 1 including the casing 7 is substantially symmetrical with respect to the circuit board 2.

Third Embodiment

Figure 9:
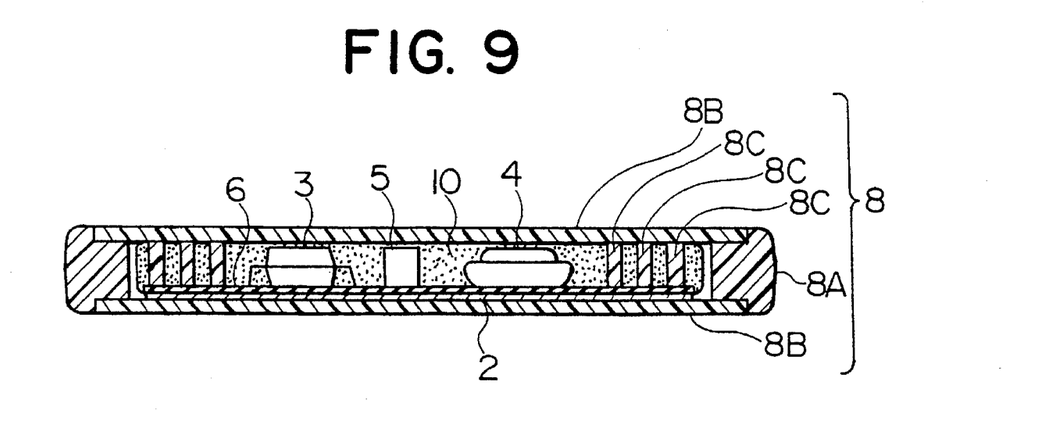
FIG. 9 is a cross-sectional view illustrating a third embodiment of the portable semiconductor device according to the present invention.
Figure 10:
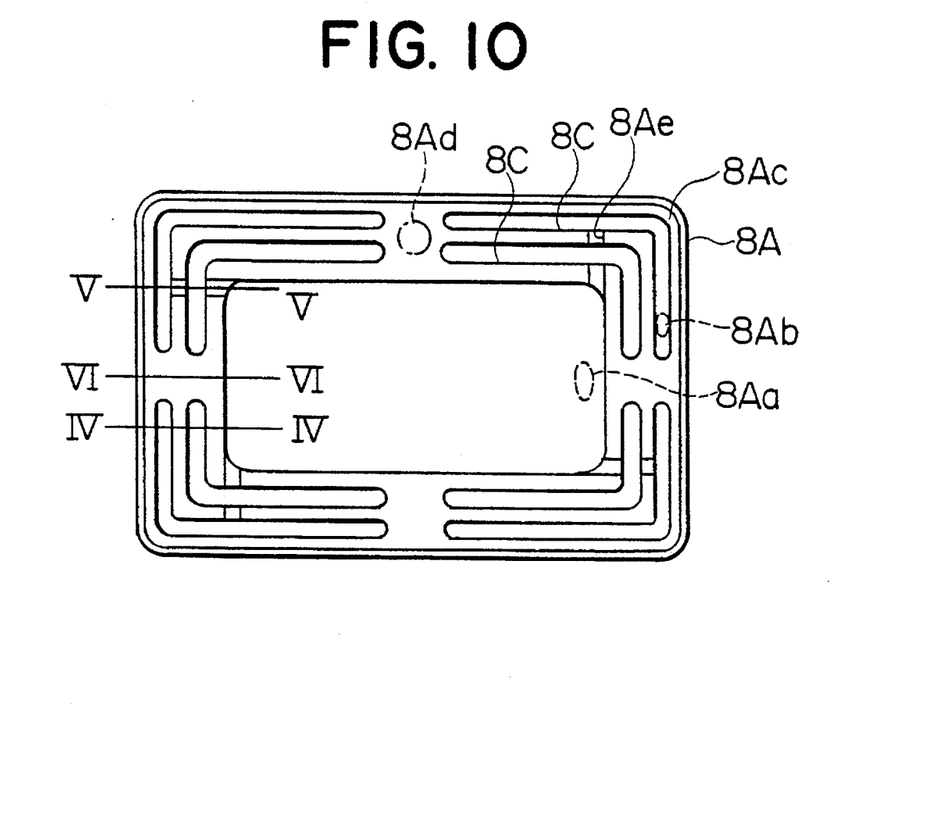
FIG. 10 is a plan view illustrating a frame used in the portable semiconductor device shown in FIG. 9.
Figure 11A:
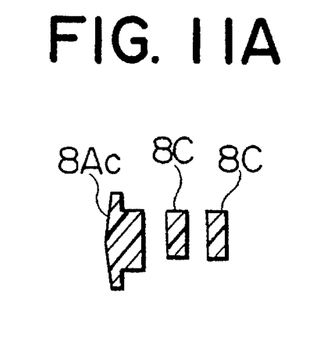
FIG. 11A is an enlarged cross-section taken along the line IV—IV of FIG. 10.
Figure 11B:
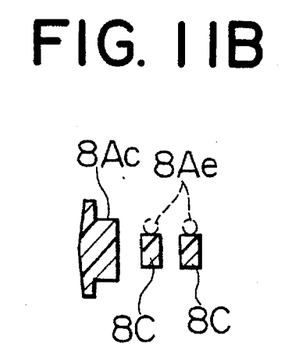
FIG. 11B is an enlarged cross-section taken along the line V—V of FIG. 10.
Figure 11C:
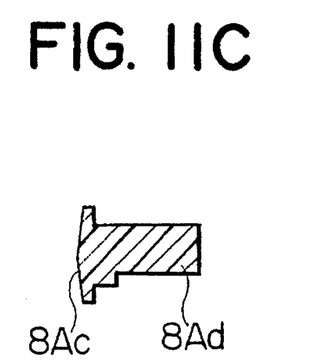
FIG. 11C is an enlarged cross-section taken along the line VI–VI of FIG. 10.

A third embodiment is shown in FIGS. 9 through 11.

Referring first to FIG. 9, an outer container 9 of the IC card 1 is composed of a frame 8A and a surface sheet material 8B. As shown in FIG. 10, the frame 8A, forming the outer edge portion of the IC card 1, has an electronic part accommodating portion 8A*a* for accommodating the functional parts of the IC card 1, and a plurality of ring-shaped ribs 8C formed at the outer peripheral edge portion of the frame 8A to form foamed resin accommodation portions 8A*b* for accommodating an excess of foamed resin 10.

FIG. 10 is a plan view of the frame 8A. FIGS. 11A through 11C are respectively enlarged cross-sections taken along the lines IV—IV, V—V and VI—VI of FIG. 10. The plurality of ribs 8C are joined to each other through a joining portion 8A*d* substantially midway between the outer peripheral portion 8A*c* of the frame 8A and the side of the IC card. The coupling portion 8A*d* supports the ring-shaped ribs 8C and divides the foamed resin accommodating portions 8A*b* constituted by the ribs 8C. A coupling groove 8A*e* for coupling the electronic part accommodating portion 8A*a* with the foamed resin accommodating portions 8A*b* is formed at each of the four corners of the ribs 8C.

To manufacture the IC card 1, one of the surface sheet materials 8B is fixed to the under surface of the frame 8A located with the coupling grooves 8A*e* of the frame 8A directed upward, whereby the state substantially the same as that shown in FIG. 6 is obtained. Next, a predetermined amount of solid foamable resin 10, the circuit board 2 with the functional parts mounted thereon, a predetermined amount of foamable resin 10 and finally the other of the surface sheet materials 8B are placed in that order, and then foaming and setting are performed. The manufacturing process is basically the same as that of the first embodiment.

In the third embodiment, a product made of an inorganic powder liquid crystal polymer is used as the frame 8A. A 250 micron-thick polyester sheet the surface of which has been printed is used as the surface sheet material 8B. The surface sheet 8B is fixed to the frame 8A using a pressure-sensitive type adhesive sheet. A three-part type foamable epoxy resin is used as the foamed resin 10, as in the case of the first embodiment. The foamable epoxy resin is compounded at a room temperature. After filled in the casing, the foamable epoxy resin was foamed and set by heating.

Fourth Embodiment

Figure 12:
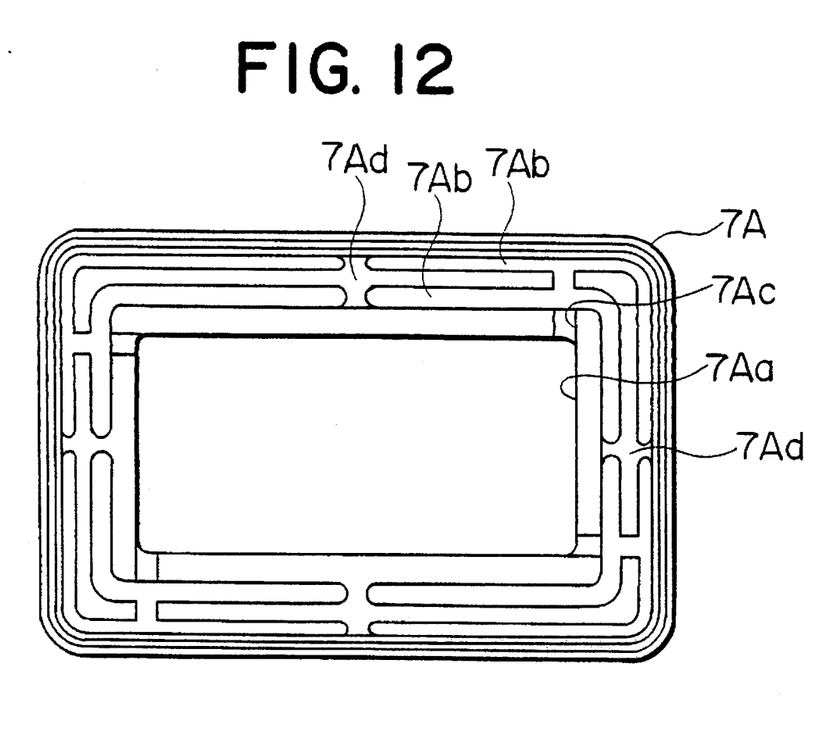
FIG. 12 is a plan view illustrating an upper casing portion used in a fourth embodiment of the portable semiconductor devices, according to the present invention.

FIG. 12 is a plan view of the upper casing portion 7A of a fourth embodiment according to the present invention as seen when looking from the inner side thereof. Although the casing 7 of the fourth embodiment is made up of the upper casing portion 7A and the lower casing portion 7B, as in the case of the first embodiment, the structure of the upper casing portion 7A is different from that of the upper casing portion 7A of the first embodiment. That is, the plurality of ring-shaped foamed resin accommodating portions 7Ab are formed parallel to each other in the peripheral edge portion of the upper casing portion 7A. The coupling groove 7Ac for coupling the electronic part accommodating portion 7Aa to the foamed resin accommodating portions 7Ab is provided at each of the four corners of the upper casing portion 7A. The ring-shaped foamed resin accommodating portions 7Ab are divided by a joining portion 7Ad for each of the coupling grooves 7Ac.

Although the material of and the manufacturing method of the IC card of the fourth embodiment are the same as those of the first embodiment and description thereof is omitted, even if one of the corner portions of the electronic part accommodating portion 7Aa is first filled with the foamable resin 10 due to an imbalanced expansion of the foamable resin 10 and the resin thus flows into the foamed resin accommodating portions 7Ab through the coupling groove 7Ac, since the foamed resin accommodating portions 7Ab are divided for each of the coupling grooves 7Ac, the resistance of the resin inevitably increases, and a non-filled portion is selectively filled with the expanding resin. Consequently, filling of the electronic part accommodating portion 7Aa is given priority to filling of the foamed resin accommodating portions 7Ab. Further, ring-shaped ribs formed parallel to the side of the card to form the foamed resin accommodating portions 7Ab increase the strength of the IC card against an external force.

Fifth Embodiment

Figure 13:
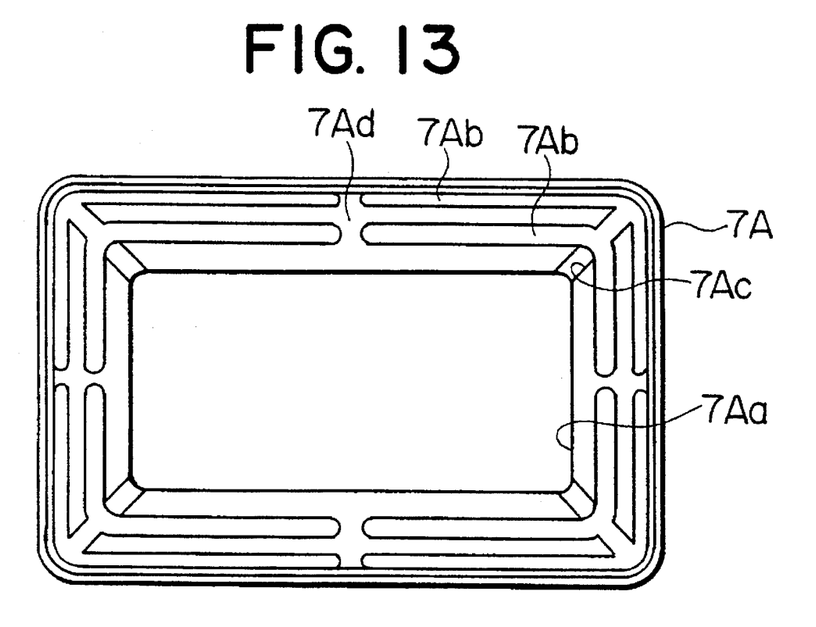
FIG. 13 is a plan view illustrating an upper casing portion used in a fifth embodiment of the portable semiconductor device according to the present invention.

FIG. 13 is a plan view of the upper casing portion 7A of the casing 7 of a fifth embodiment according to the present invention as seen when looking from the inner side thereof. The coupling groove 7Ac for coupling the electronic part accommodating portion 7Aa with the foamed resin accommodating portions 7Ab is provided at a portion which connects the corner of the electronic part accommodating portion to the corners of the foamed resin accommodating portions 7Ab. As in the case of the fourth embodiment, the foamed resin accommodating portions 7Ab are divided for each of the coupling grooves 7Ac. Further, the manufacturing method of the fifth embodiment is the same as that of the previous embodiments.

Sixth Embodiment

Figure 14:
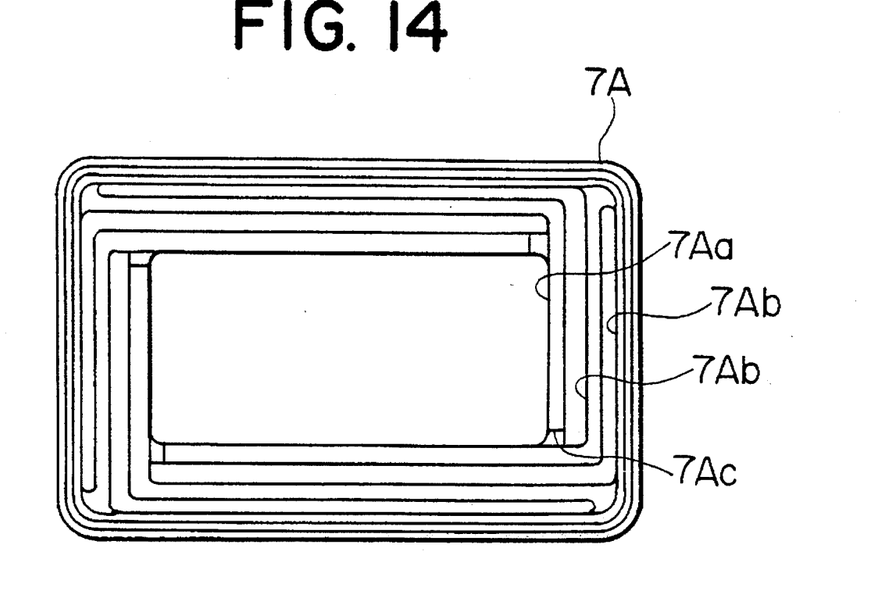
FIG. 14 is a plan view illustrating an upper casing portion is in a sixth embodiment of the portable semiconductor device according to the present invention.

FIG. 14 is a plan view of the upper casing portion 7A of the casing 7 of a sixth embodiment according to the present invention as seen when looking from the inner side thereof. The coupling groove 7Ac for joining the electronic part accommodating portion 7Aa to the foamed resin accommodating portions 7Ab is provided at each of the corners of the electronic part accommodating portion 7Aa. The foamed resin accommodating portions 7Ab for accommodating an excess of resin extend from each of the coupling grooves 7Ac along the two sides in an L-shaped form and then come to an end. Thus, the foamed resin accommodating portions 7Ab have the same effect as that of the fourth embodiment. Further, the manufacturing process of the IC card is the same as that of the previous embodiments.

Seventh Embodiment

Figure 15:
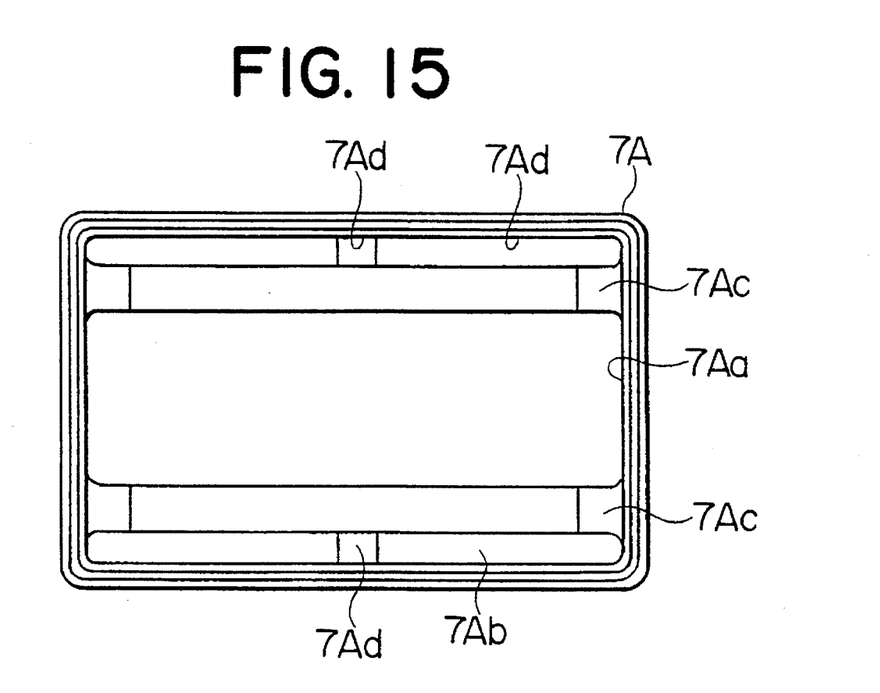
FIG. 15 is a plan view illustrating an upper casing portion used in a seventh embodiment of the portable semiconductor device according to the present invention.

FIG. 15 is a plan view of the upper casing portion 7A of the casing 7 of a seventh embodiment according to the present invention as seen when looking from the inner side thereof. The foamed resin accommodating portion 7Ab is provided along each of the two sides of the electronic part accommodating portion 7Aa, and the coupling groove 7Ac for joining the electronic part accommodating portion 7Aa to the foamed resin accommodating portion 7Ab is provided at each of the corners of the electronic part accommodating portion 7Aa. Each of the foamed resin accommodating portions 7Ab comes to an end substantially at the central portion thereof by the frame and the joining portion 7Ad so as to obtain the same effect as that of the fourth embodiment. The manufacturing process of the IC card is the same as that of the previous embodiments.

Eighth Embodiment

Figure 16:
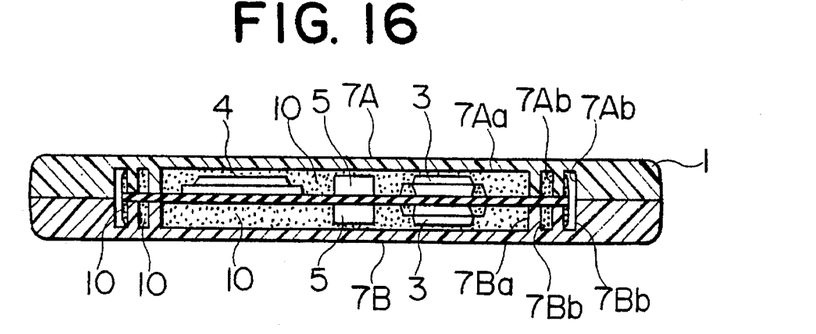
FIG. 16 is a cross-sectional view illustrating an eighth embodiment of the portable semiconductor device according to the present invention.
Figure 17:
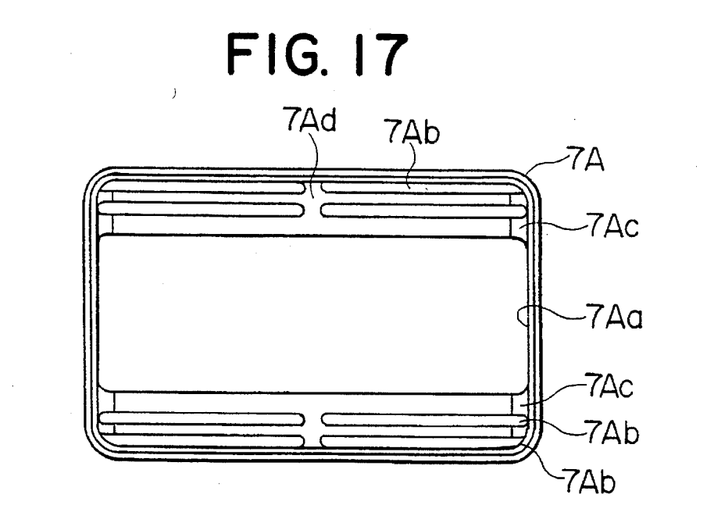
FIG. 17 is a plan view illustrating an upper casing portion used in the eighth embodiment of the present invention.

FIG. 16 is a cross-section taken along the foamed resin accommodating portion of an eighth embodiment of the IC card 1. FIG. 17 is a plan view of one casing portion 7A as seen when looking from the inner side thereof. The foamed resin accommodating portions 7Ab are provided along each of the two sides of the electronic part accommodating portion 7Aa. The casing portion 7A and the other casing portion 7B have the symmetrical structure. The material of and manufacturing process of the IC card 1 are the same as those of the first embodiment.

The foamed resin accommodating portion 7Ab formed in the casing 7 to accommodate an excess of the foamed resin is made up of three ring-shaped grooves. The coupling groove 7Ac for joining the electronic part accommodating portion 7Aa to the foamed resin accommodating portions 7Ab is provided at each of the four corners of the electronic part accommodating portion 7Aa. After the foamable resin has filled in the electronic part accommodating portion 7Aa by foaming, it flows into the foamed resin accommodating portions 7Ab through the coupling grooves 7Ac.

Ninth Embodiment

Figure 18:
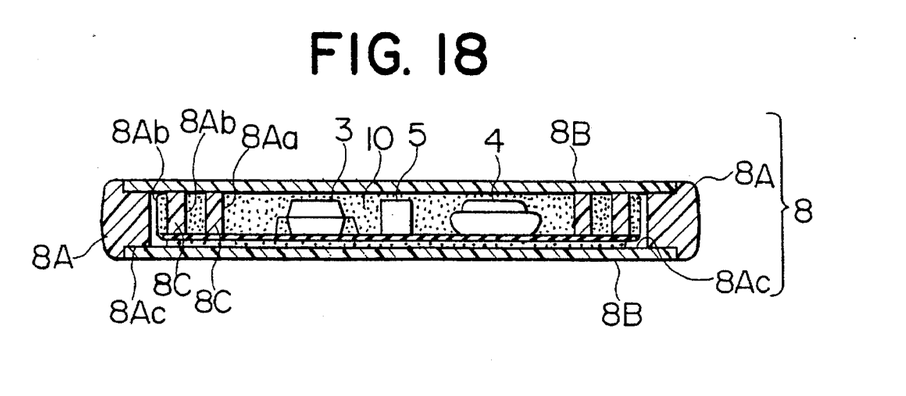
FIG. 18 is a cross-sectional view illustrating a ninth embodiment of the portable semiconductor device according to the present invention.
Figure 19:
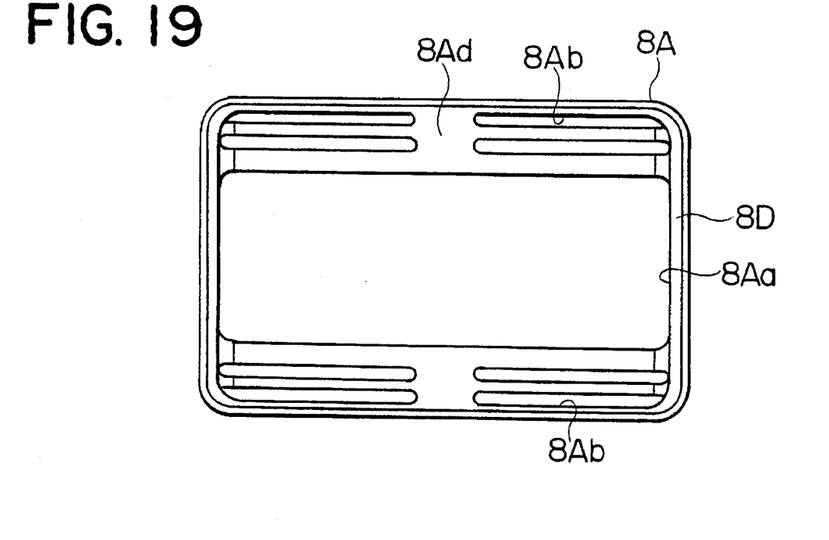
FIG. 19 is a plan view illustrating a frame of the portable semiconductor device shown in FIG. 18.

FIGS. 18 and 19 show an ninth embodiment of the IC card according to the present invention. FIG. 18 is a cross-section taken along the excess resin accommodating portion. FIG. 19 is a plan view of a frame which forms the outer container 8 composed of the frame 8A and the surface sheet materials 8B. In order to form the electronic part accommodating portion 8Aa for accommodating the functional parts of the IC card 1 and the foamed resin accommodating portions 8Ab for accommodating an excess resin, the plurality of ribs 8C are provided at the two sides oft he electronic part accommodating portion 8Aa. Consequently, the foamed resin accommodating portions 8Ab are formed between the ribs 8C and a frame outer peripheral portion 8D.

The coupling groove 8Ac for joining the electronic part accommodating portion 8Aa to the foamed resin accommodating portions 8Ab is provided at each of the four corners of the electronic part accommodating portions 8Aa where the ribs 8C contact with the frame outer peripheral portion.

In the above-described embodiments, the circuit board on which the electronic parts are mounted is completely embedded in the foamed resin of closed cells in order to embed the functional parts of the module in which the electronic parts are mounted in the foamed resin, and an excess of foamed resin is accommodated in the foamed resin accommodating portion through the coupling grooves at the corner portions. The foamed resin can then be readily charged in every corner of the electronic part accommodating portion, and the excess resin does not flow out of the outer container but is foamed in a state wherein it is sealed in the outer container of the IC card together with the circuit board on which the electronic parts are mounted. Consequently, it is possible to manufacture IC cards by the simple process in which the functional parts are completely embedded in the resin.

Further, since the foamable resin is foamed in the container in almost sealed state, the inner pressure of the IC card increases. Thus, the hardening jig presses against the surface of the card during foaming, making the surface of the outer container flat, and the container is fixed in that state due to the setting of the resin. Consequently, generation of an internal stress due to the shrinkage on curing or the heat shrinkage of the resin, which would occur when a normal casing resin is injected and set or generation of shrink marks on the surface of the IC card due to shrinkage can be eliminated, and an IC card which looks nice can thus be obtained. In the above-described embodiments, although the casing, serving as the outer container, is almost sealed in a fitted state, one portion of the casing may be simply placed on top of the other or the casing may be fixed by adhesion, as long as the expanding resin does not leak from the joined portion.

The coupling groove provided in the casing or frame for joining the electronic part accommodating portion to the foamed resin accommodating portion is shallower than the electronic part accommodating portion or the foamed resin accommodating portion, it may be made deeper according to the viscosity of the filling foamable resin in order to obtain a suitable resistance to the foaming resin which passes through the coupling groove.

In the above embodiments, although the foamed resin accommodating portions are provided around and on the two sides of the electronic part accommodating portion, they may be provided on one side thereof depending on the foamed resin or the shape of or volume of the circuit board to be embedded.

Further, where the outer container is formed by combining the surface sheet materials with the frame, the surface sheet materials alone may be peeled off. However, in a casing where the foamed resin accommodating portions are formed integrally with the outer container, the design printed on the surface of the casing cannot be separated from the card body.

It is possible to take more suitable measures according to the viscosity of a solid foamable resin to be filled or the void of the foamed resin by modifying the shape of the foamed resin accommodating portion provided at the outer periphery of the electronic part accommodating portion and the shape, position and site of the coupling groove. Further, although the casing and the frame, which form the outer container of the IC card, are made of a liquid crystal polymer in the above-described embodiments, other generally employed plastics, such as a polycarbonate, a polybutylene terephthalate or ABS, may be selectively used depending on the objective.

As will be understood from the foregoing description, since the outer container of the IC card according to the present invention has an electronic part accommodating portion, a foamed resin accommodating portion for accommodating an excess of foamed resin and coupling grooves for coupling the electronic part accommodating portion to the foamed resin accommodating portion, a solid foamable resin charged in the electronic part accommodating portion fills the electronic part accommodating portion while readily discharging the air in the electronic part accommodating portion from the coupling grooves in the expansion process of the resin with an excess of the resin flowing into the foamed resin accommodating portion through the coupling grooves. Thereafter, the foamable resin is set. It is therefore possible to provide IC cards exhibiting excellent resistance to environment by the simple manufacturing process. Further, the electronic part accommodating portion can be completely filled with the foamed resin by providing the coupling grooves at all the sites in the electronic part accommodating portion where the non-filling of the resin readily occurs.

Further, since the foamed resin which encloses all the electronic parts of the device absorbs an external force applied to the semiconductor device, particularly, a mechanical shock, it is possible to provide a portable semiconductor device which exhibits excellent resistance to shock. Further, since the semiconductor device is accommodated in an almost sealed state and is completely embedded in the resin having closed cells, it has excellent resistance to various types of liquid soiling substances and hence excellent resistance to environment.

Furthermore, even if part of the electronic part accommodating portion is first filled with the foamable resin due to an imbalanced expansion of the foamable resin and the resin thus flows into the foamed resin accommodating portions through the coupling groove, since the foamed resin accommodating portions are divided for each of the coupling grooves, the resistance of the resin inevitably increases, and a non-filled portion is selectively filled with the expanding resin. Consequently, filling of the electronic part accommodating portion is given priority to filling of the foamed resin accommodating portions. Further, the ring-shaped ribs formed parallel to the side of the card to form the foamed resin accommodating portions increase the strength of the IC card against an external force.

What is claimed is:

1. A portable semiconductor device comprising:

a two-part container serving as an outer skin;

a circuit board on which electronic parts are mounted, said circuit board being accommodated in said container; and a foamed resin filled in a gap between said container and said circuit board, wherein at least one part of said two-part container has a recessed electronic part accommodating portion in which the electronic parts mounted on said circuit board are accommodated and in which said foamed resin is charged, a foamed resin accommodating portion provided at a peripheral edge portion of said container to accommodate an excess of foamed resin, and being partitioned from said electronic part accommodating portion by a rib, and a coupling groove extending through said rib for coupling said electronic part accommodating portion to said foamed resin accommodating portion.

2. A portable semiconductor device according to claim 1 wherein said foamed resin accommodating portion comprises a plurality of ring-shaped grooves.

3. A portable semiconductor device according to claim 1 wherein said foamed resin accommodating portion comprises a plurality of L-shaped grooves.

4. A portable semiconductor device according to claim 1, wherein said foamed resin accommodating portion further comprises at least one division disposed therein to create at least two separate reservoirs each of which is coupled to said electronic part accomodating portion via an associated coupling groove.

5. The portable semiconductor device of claim 1, wherein said foamed resin has a modulus of elasticity of about 60 kg/mm$^2$.

6. A portable semiconductor device comprising:

a container serving as an outer skin, said container including a frame serving as an outer edge portion, and a surface sheet material adhered to each of two surfaces of said frame;

a circuit board on which electronic parts are mounted, said circuit board being accommodated in said container; and a foamed resin filling a gap between said container and said circuit board, wherein a rib is formed integrally with said frame on an inner side of said frame, whereby an electronic part accommodating portion in which said electronic parts on said circuit board are mounted and in which said foamed resin is charged is formed on an inner side of said rib and whereby a foamed resin accommodating portion for accommodating an excess of the foamed resin in said electronic part accommodating portion is formed between said rib and said a peripheral edge portion of said frame, and wherein a coupling groove for coupling said electronic part accommodating portion to said foamed resin accommodating portion is provided.

7. A portable semiconductor device according to claim 6 wherein said foamed resin accommodating portion comprises a plurality of ring-shaped grooves.

8. A portable semiconductor device according to claim 6 wherein said foamed resin accommodating portion comprises a plurality of L-shaped grooves.

9. A portable semiconductor device according to claim 6, wherein said foamed resin accommodating portion further comprises at least one division disposed therein to create at least two separate reservoirs each of which is coupled to said electronic part accomodating portion via an associated coupling groove.

10. A portable semiconductor device according to claim 9, wherein the at least one division of the foamed resin accommodating portion directs the excess foamed resin to those of said at least two reservoirs of the foamed resin accommodating portion that are unfilled.

11. A portable semiconductor device according to claim 6, further comprising means for directing said excess foamed resin evenly throughout the foamed resin accommodating portion via a plurality of coupling grooves.

12. A semiconductor device comprising:

a container serving as an outer shell;

a circuit board on which electronic parts are mounted, said circuit board being disposed in said container; and a foamed resin which fills a gap between said container and said circuit board, wherein said container has an electronic part accommodating portion to accommodate said circuit board, a resin accommodating portion disposed along a perimeter of said container to accommodate an excess of foamed resin, said resin accommodating portion being partitioned from said electronic part accommodating portion by a rib, and a coupling groove extending through said rib to couple said electronic part accommodating portion to said resin accommodating portion.

13. A semiconductor device according to claim 12, wherein said resin accommodating portion further comprises at least one division disposed therein to create at least two separate reservoirs each of which is coupled to said electronic part accommodating portion via an associated coupling groove.

14. A semiconductor device according to claim 13, wherein the at least one division of the resin accommodating portion directs the excess foamed resin to those of said at least two reservoirs of the resin accommodating portion that are unfilled.

15. A semiconductor device according to claim 13, wherein the resin accommodating portion is provided along each of two sides of the electronic part accommodating portion.

16. A semiconductor device according to claim 12, further comprising means for directing said excess foamed resin evenly throughout the resin accommodating portion via a plurality of coupling grooves.

17. A semiconductor device according to claim 12, wherein said resin accommodating portion comprises a plurality of ring-shaped grooves.

18. A semiconductor device according to claim 12, wherein said resin accommodating portion comprises a plurality of L-shaped grooves.

19. A semiconductor device according to claim 12, wherein said container further comprises:

a frame serving as an outer edge portion; and a surface sheet material adhered to each of two surfaces of said frame.

20. A semiconductor device according to claim 12, wherein said container further comprises an upper casing portion and a lower casing portion.

21. A semiconductor device according to claim 12, wherein said foamed resin expands in volume to fill said electronic part accommodating portion and said resin accommodating portion.

22. A semiconductor device according to claim 12, wherein the resin accommodating portion is provided along one side of the electronic part accommodating portion.

23. An integrated circuit card comprising:

a container serving as an outer shell of the integrated circuit card;

a circuit board disposed in said container; and a resin which fills a gap between said container and said circuit board, wherein said container has an electronic part accommodating portion to accommodate said circuit board, a resin accommodating portion disposed along a peripheral edge of said container to accommodate an excess of resin, said resin accommodating portion being partitioned from said electronic part accommodating portion by a rib, and a coupling groove extending through said rib to couple said electronic part accommodating portion to said resin accommodating portion.

24. The integrated circuit card of claim 23, wherein said resin accommodating portion comprises a plurality of ring-shaped grooves.

25. The integrated circuit card of claim 23, wherein said resin accommodating portion comprises a plurality of L-shaped grooves.

26. The integrated circuit card of claim 23, wherein said resin accommodating portion further comprises at least one division disposed therein to create at least two separate reservoirs each of which is coupled to said electronic part accommodating portion via an associated coupling groove.

27. The integrated circuit card of claim 23, wherein said resin comprises a foamed resin which expands in volume to fill said electronic part accommodating portion and said resin accommodating portion.

* * * * *